United States Patent
How et al.

(10) Patent No.: US 9,806,696 B1
(45) Date of Patent: Oct. 31, 2017

(54) SYSTEMS AND METHODS FOR A LOW HOLD-TIME SEQUENTIAL INPUT STAGE

(71) Applicant: Altera Corporation, San Jose, CA (US)

(72) Inventors: Dana How, Palo Alto, CA (US); Herman Henry Schmit, Palo Alto, CA (US)

(73) Assignee: ALTERA CORPORATION, San Jose, CA (US)

( * ) Notice: Subject to any disclaimer, the term of this patent is extended or adjusted under 35 U.S.C. 154(b) by 0 days.

(21) Appl. No.: 14/978,165

(22) Filed: Dec. 22, 2015

(51) Int. Cl.
*H03K 3/00* (2006.01)
*H03K 3/037* (2006.01)

(52) U.S. Cl.
CPC .................................. *H03K 3/037* (2013.01)

(58) Field of Classification Search
None
See application file for complete search history.

(56) References Cited

U.S. PATENT DOCUMENTS

| | | | |
|---|---|---|---|
| 7,330,050 B2 * | 2/2008 | Redgrave | H03K 19/1776 326/37 |
| 9,531,351 B1 * | 12/2016 | Devlin | H03K 3/0372 |
| 2007/0013424 A1 * | 1/2007 | Padaparambil | H03K 17/693 327/199 |
| 2010/0034030 A1 * | 2/2010 | Asano | H03K 3/356156 365/189.05 |
| 2010/0213977 A1 * | 8/2010 | Redgrave | H03K 19/1776 326/40 |
| 2013/0093462 A1 * | 4/2013 | Teig | H03K 19/17744 326/38 |

* cited by examiner

*Primary Examiner* — Lincoln Donovan
*Assistant Examiner* — Khareem E Alamo
(74) *Attorney, Agent, or Firm* — Fletcher Yoder, P.C.

(57) ABSTRACT

Systems and methods for a low hold-time sequential input stage provide circuitry that includes a first latch element receiving a first input. The first latch element is connected to a first two-input multiplexer. The circuitry further includes a second latch element receiving a second input. The second latch element is connected to the first two-input multiplexer. The first input and the second input originate from different input cells of an input column that receive a same source signal.

19 Claims, 8 Drawing Sheets

SYSTEMS AND METHODS FOR A LOW HOLD-TIME SEQUENTIAL INPUT STAGE

FIELD OF THE INVENTION

This invention relates to a low-hold-time sequential input stage scheme for configurable logic elements.

BACKGROUND OF THE INVENTION

A circuit system usually has a clock input and data inputs. The clock input can drive various components in the circuit system at a rising edge of the clock signal. The components responding to the rising edge need their inputs "held" constant for a small time past the rising edge, reducing the portion of the clock period available for useful computation and thus reducing circuit performance. Latches can be used for sequential components as a cost-efficient solution in a circuit system. At a low overhead cost, a latch can serve in a similar way to a flip-flop by pulsing the enable pin of the latch. However, such pulsed latches may induce a longer hold-time that is difficult for a short data path with little or no logic to mitigate.

SUMMARY OF THE INVENTION

In accordance with embodiments of the present invention, a low-hold-time sequential input stage mechanism is provided to include a multiplexer after a group of parallel latches configured to implement a double edge triggered flip-flop to provide a low hold-time.

Therefore, in accordance with embodiments of the present invention there is provided circuitry that includes a first latch element receiving a first input. The first latch element connected to a first two-input multiplexer. The circuitry further includes a second latch element receiving a second input. The second latch element connected to the first two-input multiplexer. The first input and the second input originate from different input cells of an input column.

In accordance with another embodiment of the present invention there is provided a method of configuring an input stage circuit. The method includes configuring a first latch element to receive a first input. The first latch element connected to a first two-input multiplexer. The method further includes configuring a second latch element to receive a second input. The second latch element connected to the first two-input multiplexer. The method further includes configuring the input cells of an input column, from which originate the first input and the second input, to originate from the same source signal.

In accordance with another embodiment of the present invention there is provided a processor-readable non-transitory medium storing processor-executable instructions for configuring an input stage circuit. The processor-executable instructions include instructions executable by a processor to configure a first latch element to receive a first input. The first latch element connected to a first two-input multiplexer. The instructions further include instructions executable by the processor to configure a second latch element to receive a second input. The second latch element connected to the first two-input multiplexer. The instructions further include instructions executable by the processor to configure the input cells of an input column, from which originate the first input and the second input, to originate from the same source signal.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Unless otherwise indicated, the discussion that follows will be based on an example of a programmable integrated circuit device such as a field-programmable gate array (FPGA). However, it should be noted that the subject matter disclosed herein may be used in any kind of fixed or programmable device, including, but not limited to, an application-specific integrated circuit (ASIC).

Systems and methods described herein provide a low-hold-time sequential input stage scheme. The input stage includes a multiplexer disposed adjacent to a pair of parallel latches that are configured to implement a double edge triggered flip-flop. The input stage of a configurable logic element can be implemented in a column of multiple inputs, and the multiplexers can be placed in a column accordingly. At the input stage, two latches in parallel can be used to build a Double-Edge-Triggered (DET) flip-flop with low hold-time, out of two input stages followed by a transmission gate (T-gate) multiplexer. The input stages can be arranged so as to avoid a low hold-time input being placed above an independently used input. In this way, each pair of latches and the multiplexer can form a latch-based sequential input stage for a low hold-time input. As each pair of latches is positioned in a parallel manner, the mechanism can be area-efficient to provide a latch-based sequential input stage.

Figure 1:
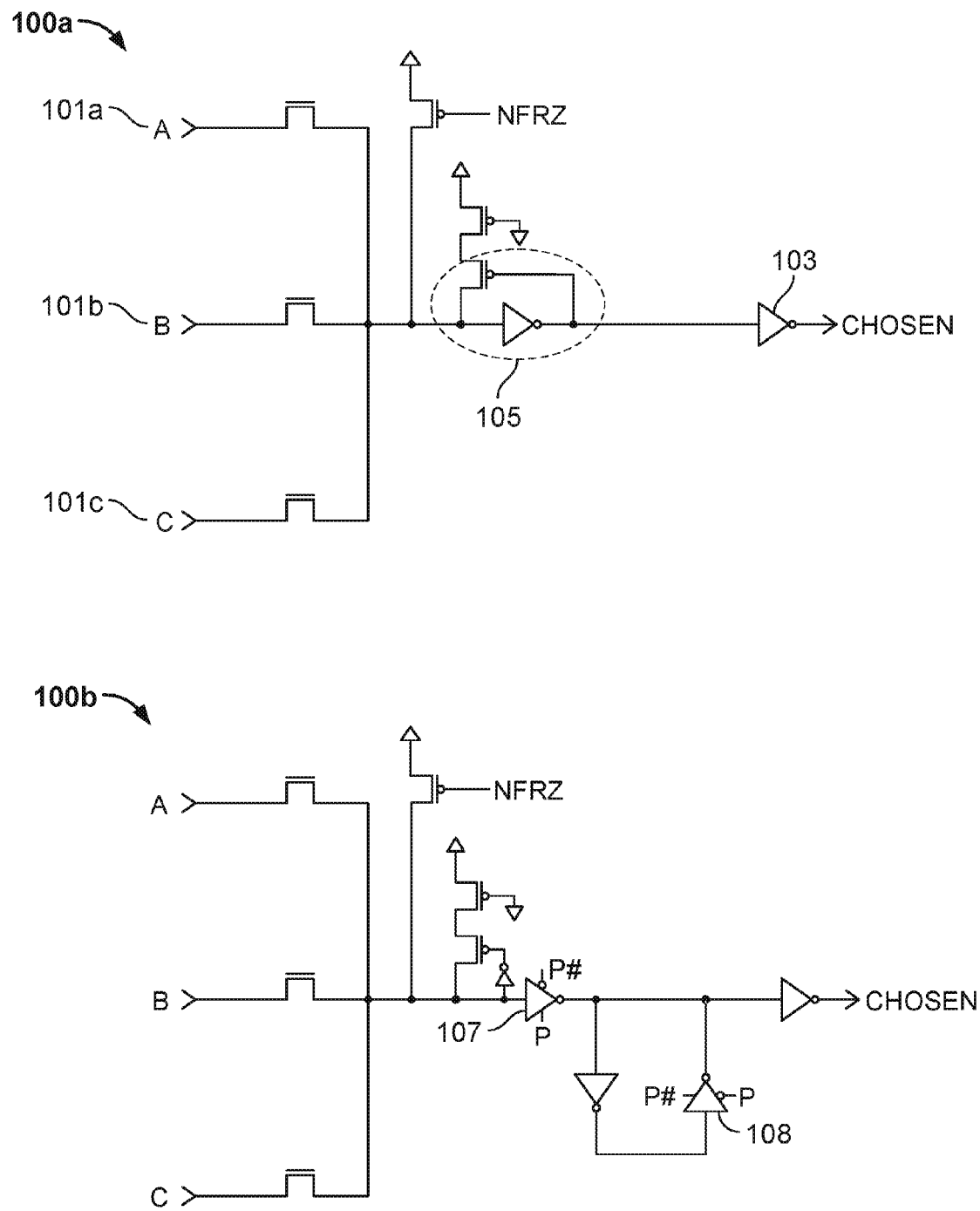
FIG. 1 shows example block diagrams illustrating example circuit components with input stages for selection and buffering.

FIG. 1 shows example block diagrams illustrating example circuit components with input stages for selection and buffering. As shown, the input stage 100a of a configurable logic element that has been used in the existing art can be entirely combinational, performing only selection and buffering functions. For example, the input stage can choose among input A (101*a*), input B (101*b*), and input C (101*c*) and output a chosen signal at the inverter 103. The p-channel metal-oxide-semiconductor field-effect transistors (pMOS-FETs) and the inverter structure 105 can perform buffering of the selected inputs and feed the selected input to the output inverter 103.

The input stage 100*b*, which is provided by STRATIX® 10 by Altera Corporation, of San Jose, Calif., adds a memory element to the internal node. Such a memory element can be added at all routing decision points including input stages. For example, two tri-state inverters 107-108 can be added to the input stage structure such that the tri-state inverters 107-108 can be forced to assume a previous function, or to be driven from a clock or a pulse generator to function as a latch or a pulsed latch. When inverter 107 is turned on and inverter 108 is turned off, the input stage structure 100*b* may function in a similar way as the input stage structure 100*a*.

The state elements such as the tri-state inverters 107-108 may be placed at different places on a circuit. Data paths within the circuit may yield different delays along each data path. The circuit may be retimed to optimize the delay performance of different data paths, e.g., by moving registers, or other state elements around to average out data path delays within the circuit. For example, when the state elements are moved around for retiming, sometimes data paths with relatively less logic elements may receive more state elements in order to match another data path with more logic elements. However, if the routing/logic delay in between the state elements is less than the latch pulse width, a hold violation may occur due to retiming. Thus, an area-efficient low-hold-time state element can help improve retiming flexibility and performance without incurring excessive consumption of circuit space.

One option is to use state elements along a logic/routing path as level-sensitive latches with alternating positive and negative clocks. This structure, however, may not always be feasible on a circuit due to hardware constraints. For example, the circuit may not have sufficient routing points to form the logic/routing path. For another example, clock selection for the level-sensitive latch can be limited, e.g., sometimes the positive clocks can drive the negative clocks, and the negative clocks may drive the positive clocks vice versa, and thus only a reduced number of clocks to drive the latches may be present on the circuit).

Figure 2:
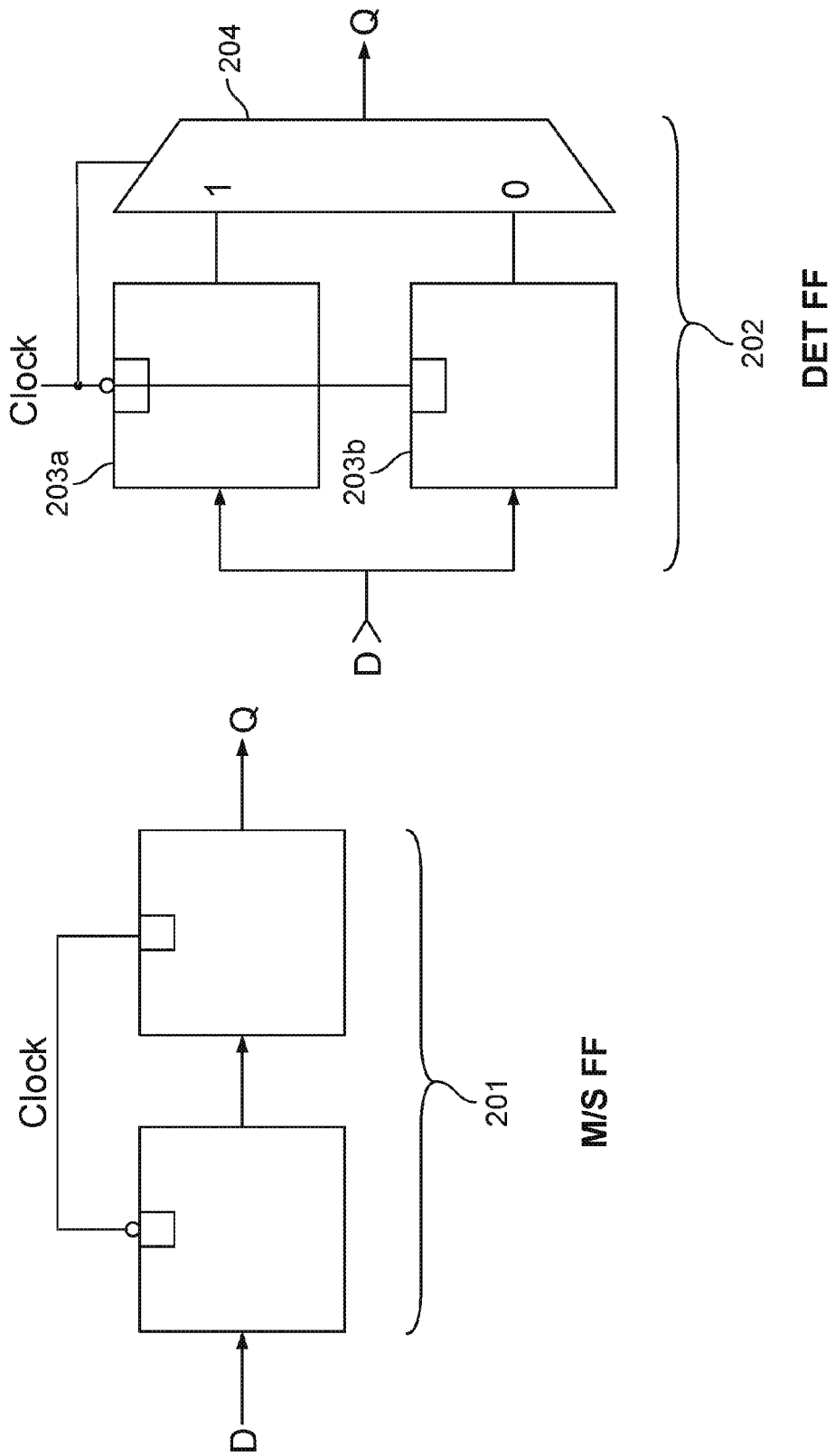
FIG. 2 shows example block diagrams illustrating alternative example configurations using latches to build various flip-flop structures.

FIG. 2 shows example block diagrams illustrating alternative example configurations to use latch structures to build various types of flip-flops. A master/slave (M/S) flip-flop 201 (e.g., two latches in series at one point) can be used. The M/S flip-flop 201, however, can take up circuit area because of the serial structure, and induce excessive delays. For example, if the M/S flip-flop 201 is no longer needed, both latches may need to be bypassed or to be passed through two stages. This may incur further delay or extra area, when the M/S flip-flop 201 needs to be forced transparent (i.e., not used).

A Double-Edge-Triggered (DET) flip-flop 202, built from two latches 203*a-b* in parallel followed by a multiplexer 204, can be faster in the transparent mode because the DET flip-flop 202 does not need to bypass two latches in sequence. Although the DET flip-flop 202 can still have the data flow through an extra multiplexer 204 which selects an opaque latch, this mechanism could be faster than the M/S flip-flop 201 because the multiplexer 204 can be faster than a transparent latch. The DET flip-flop 202, however, still requires additional circuit area for the extra multiplexer 204 compared to the M/S flip-flop 201.

Figure 3:
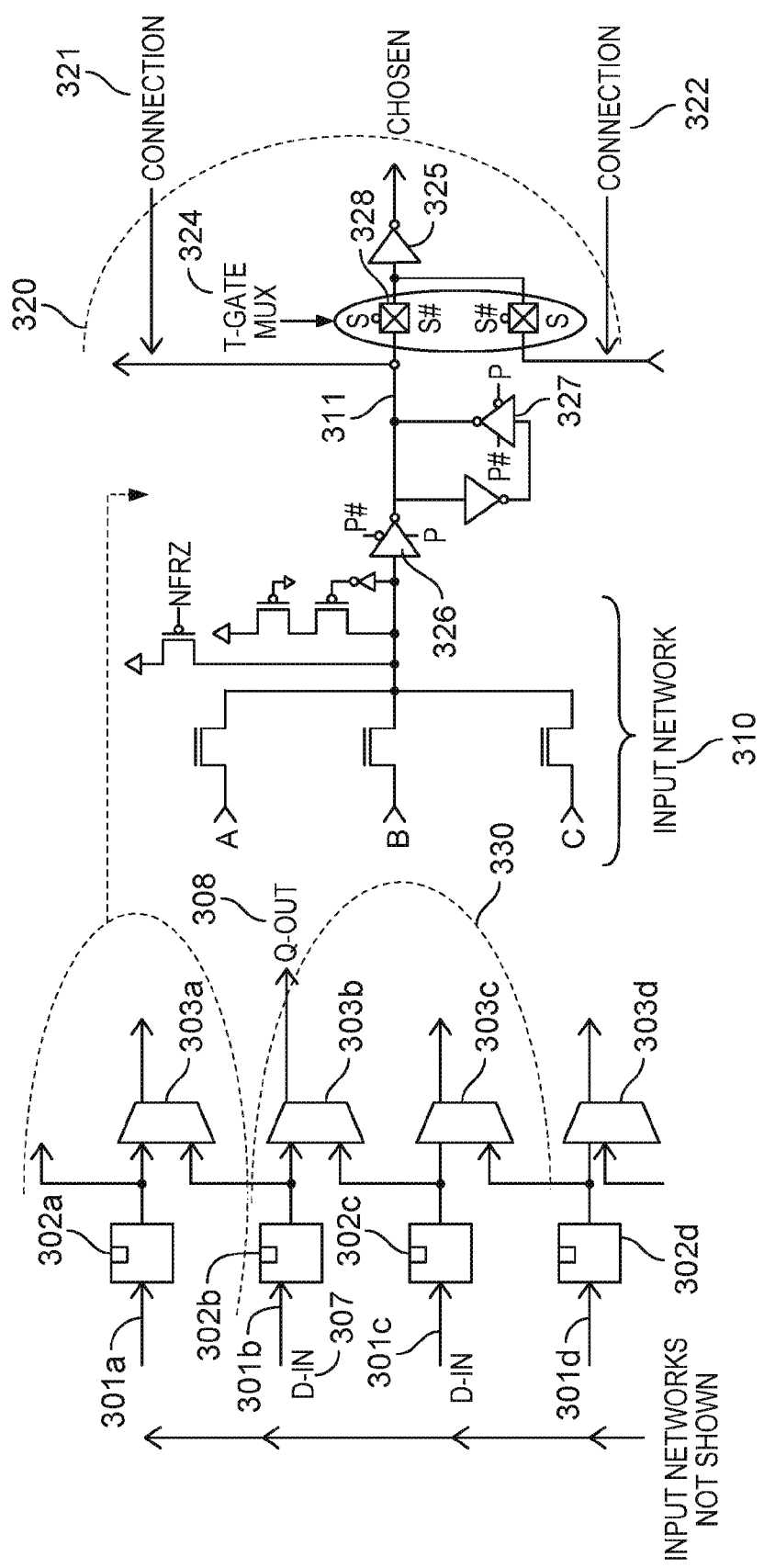
FIG. 3 shows an example circuit diagram illustrating an input stage structure for a column input network.

FIG. 3 shows an example circuit diagram illustrating an input stage structure for a column input network. For example, inputs 301*a-d* can be placed in one vertical column, each having one latch, e.g., 302*a-d*. A T-gate multiplexer 303*a-d* can be placed between the state elements 302*a-d* and the final driver (e.g., selected data output $Q_{out}$ 308). Thus, each T-gate multiplexer 303*a-d* can select from a first (original) source, which is the state element to the left of each T-gate multiplexer (e.g., 302*a* to 303*a*, etc.), and a second (new) source, which is the state element directly below each T-gate multiplexer (e.g., 302*b* to 303*a*, etc.), to form the final driver output $Q_{out}$ 308. In this way, a DET flip-flop similar to the DET flip-flop 202 in FIG. 2 can be built from two stacked input stages.

Circuit 320 shows a detailed view of the input stage including inputs 301*a-c*, state element 302*a* and the multiplexer 303*a*. Following a structure similar to 100*b* in FIG. 1, a T-gate multiplexer 324 is placed before the output inverter 325. The T-gate multiplexer 324 has one data input 311 from the input network 310, and another data input 322 from another input stage (not shown). Similarly, the data input 311 is fed into another T-gate multiplexer (not shown) as the data input 321. This structure can be transparent, level-latched (e.g., acting as a latch), pulse-latched (e.g., acting as a flip-fop with a higher hold-time), or function as a DET flip-flop with a low hold-time. The DET flip-flop function may have a low hold time since the hold time is the same as the hold times of its constituent latches, which will be comparable to the hold time of a master slave flip flop. For example, the circuit 320 may route a clock signal to the tri-state inverter 326, and then the T-gate mux 324 to provide a DET flip-flop, which uses two input stages 330 to drive one output, e.g., $D_{out}$ 308, with the driving clock being divided by two, as further illustrated in FIG. 4.

Using the column-based input stage structure shown in FIG. 3, the on-path cost for each data input path is only a 2-input T-gate multiplexer, which includes 4 field-effect transistors (FETs)/input stages, and additional off-path control logic (not shown, but most can be shared among different input columns). Thus, the low on-path cost can result in a small delay when the latches 302*a-d* are transparent (unused). In addition, the hold-time can be similar to an M/S flip-flop, which provides an area-efficient low-hold-time solution.

When the input stage 330 is operated in a DET flip-flop mode, the input in the DET mode will block the input below. In the column-based input structure, most inputs are swappable, and thus the circuit can be designed in a way to put a swappable input below a non-swappable input. Thus in this case, at most half of the inputs can be in the DET flip-flop mode. Further discussion of the swappable inputs is provided in relation to FIG. 5.

Figure 4:
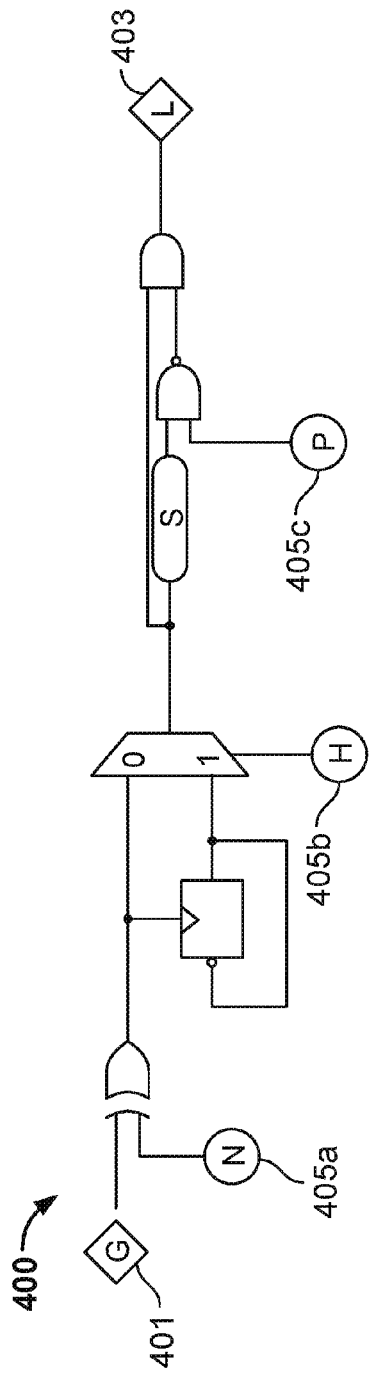
FIGS. 4-5 show example circuit diagrams illustrating example mechanisms for dividing the driving clock for the input stage structure shown in FIG. 3.
Figure 5:
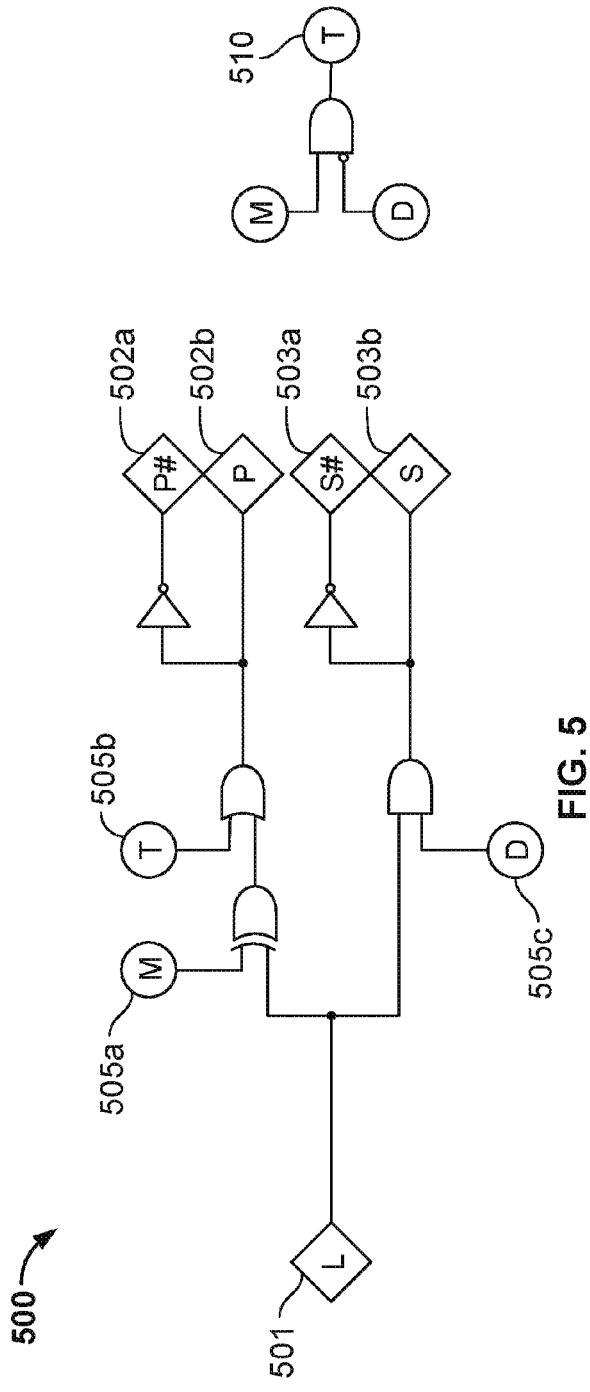

FIGS. 4-5 show example circuit diagrams illustrating example mechanisms for dividing the driving clock for the input stages in FIG. 3. As shown in FIG. 4, the circuit structure 400 can be shared between all the data inputs. The circuit accepts a global clock G 401, from which it produces a local clock L 403 distributed to the different inputs (e.g., see 301*a-d* in FIG. 3) on one block. The components of the circuit 400 to generate clock L 403 may vary depending on the type of the sequential elements that are used in the circuit 320. The circuit 400 divides the general clock G 401 in half in order to build a DET flip-flop that acts in a similar way as a normal flip-flop.

FIG. 5 provides a circuit structure 500 that may be used on an individual input. The circuit 500 configures an operating mode for the respective individual input, including but not limited to a transparent mode, a single sequential mode, and a double sequential mode. The local clock L 501 (e.g., generated from the circuit 400 at 403 in FIG. 4) is fed into the circuit 500 and then the appropriate P 502b, P#502a, S 503b, and S#503a signals are generated. The signals 502a-b, and 503a-b can be used for the P/P#, S/S# signals in FIG. 3, correspondingly.

Each of the two circuits 400 and 500 shown in FIGS. 4-5 has three configuration bits to control the respective circuit operation. For example, the circuit 400 has configuration bits N 405a, H 405b and P 405c; and the circuit 500 has configuration bits M 505a, T 505b and D 505c. The following table provides example bit settings of the configuration bits and the corresponding operating modes.

TABLE 1

Configuration Bits for Operating Modes

| | | Clocking Mode | | | Input Mode | | |
|---|---|---|---|---|---|---|---|
| Tag | Behavior | N | H | P | T | M | D |
| C | Combinational | X | X | X | 1 | X | 0 |
| LH1 | Latch Enable High | 0 | 0 | 0 | 0 | 0 | 0 |
| LL1 | Latch Enable Low | 1 | 0 | 0 | 0 | 0 | 0 |
| LH2 | Latch Enable High | 0 | 0 | 0 | 0 | 0 | 0 |
| LL2 | Latch Enable Low | 0 | 0 | 0 | 0 | 1 | 0 |
| PR | Pulsed Rising Edge | 0 | 0 | 1 | 0 | 0 | 0 |
| PF | Pulsed Falling Edge | 1 | 0 | 1 | 0 | 0 | 0 |
| LHRT | Low-Hold Rising Edge top input | 0 | 1 | 0 | 0 | 0 | 1 |
| LHRB | Low-Hold Rising Edge bottom input | | | | 0 | 1 | 1 |
| LHFT | Low-Hold Falling Edge top input | 1 | 1 | 0 | 0 | 0 | 1 |
| LHFB | Low-Hold Falling Edge bottom input | | | | 0 | 1 | 1 |
| DT | Double-Edge-Triggered Flip-flop top input | X | 0 | 0 | 0 | 0 | 1 |
| DB | Double-Edge-Triggered Flip-flop bottom input | | | | 0 | 1 | 1 |

Specifically, to configure operating modes C, LH1, LL1, PR, and PF, only bits N, P, and T are needed (e.g., H, M, and D can all be zero). The operating mode C is the transparent combinational mode, where the input stage has no sequential behavior and the input value just flows through combinationally. When operated under the operating modes LH1/LL1, the input stage acts as a conventional latch; and the generator can pass through the clock, either uninverted (LH1) or inverted (LL1). The PR and PF modes make the input stage act as a pulsed latch, which can act similarly to a flip-flop but with a high hold-time. For these modes, the pulse generation is selected (e.g., P=1). The L clock can be generated using the circuit 400 from the general clock G, and the P signal can be generated using an OR gate operating on the T configuration bit and the L clock.

The operating modes LHRT, LHRB, LHFT, and LHFB can be activated when the general clock G is divided in half (e.g., H=1). For a pair of inputs (e.g., see 330 in FIG. 3), the paired input multiplexer is turned on for a DET flip-flip (e.g., D=1). The inputs in the input pair are configured to differ in their respective local bit settings: the top input (e.g., input 301b in the input pair 330 in FIG. 3) has M=0 and the bottom input (e.g., input 301c in the input pair 330 in FIG. 3) has M=1. This is because the two parallel latches in a DET flip-flop need to have clocks which are the inverses of each other.

Additional implementations can be provided by the clock dividing circuits 400 and 500. For example, if the input stages are set in DET mode (e.g., TMD=001 or 011), but H=0 and P=0 (no clock dividing and no clock pulsing), then the two input stages in a pair can act like a real DET flip-flop, instead of a DET flip-flop operated on a halved clock that simulates a normal flip-flop.

In a further implementation, as the circuit 500 controlled by the TMD bits can locally invert the clock L 501, the operating modes LH2/LL2 can be configured to behave in a same way as operating modes LH1/LL1. As shown in FIGS. 3-5, within one input block's inputs, the clocking mode settings cannot be mixed as all inputs share the same local clock L 501. The operating modes LH2/LL2 can have the same clocking mode but different input modes, so they can be mixed in the same block, which could be useful in some applications. This configuration, however, requires configuration bit T to be treated as a separate independent configuration bit. Instead, if the operating modes LH2/LL2 are not provided, the T configuration bit can be removed: TMD=110 can achieve the operating mode C, and then T can be generated by T=AND(M, NOT(D)), which is shown by the circuit 510 in FIG. 5.

As shown in FIGS. 4-5 and Table I, each input can independently choose between a combinationally transparent mode, and one or more clocking modes determined by configuration bits NHP, and possibly further determined by configuration bits TMD. Specifically, some existing clock dividing techniques do not employ the configuration bits H or MD, and may have only the configuration bit T on each input, which is used to locally select combinational transparent, with the clocking mode entirely selected by the configuration bits NP.

Figure 6:
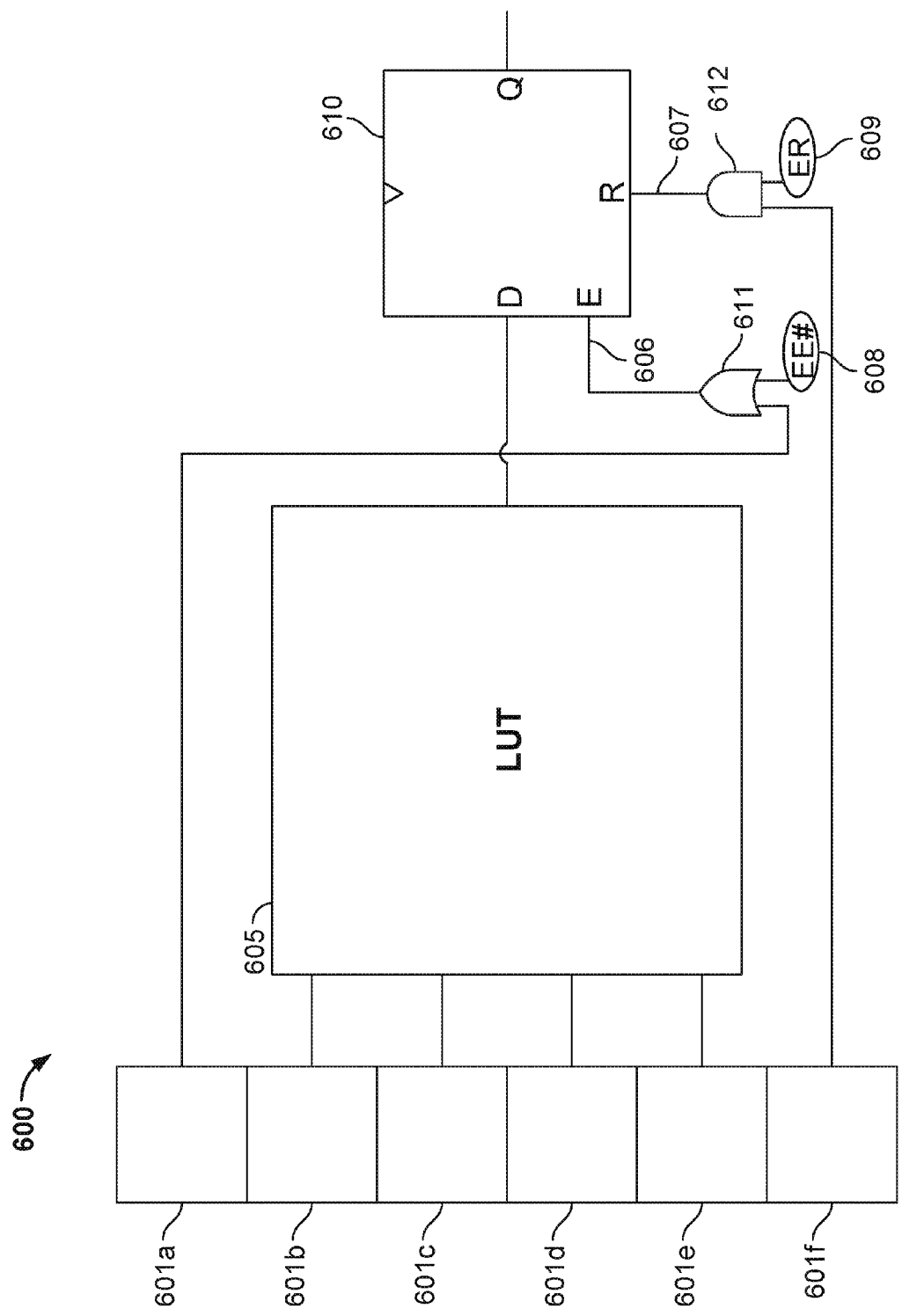
FIG. 6 shows an example circuit diagram illustrating aspects of swappable inputs of an input column (e.g., similar to inputs 301a-d in FIG. 3).

FIG. 6 provides an example circuit diagram illustrating aspects of swappable inputs of an input column (e.g., similar to inputs 301a-d in FIG. 3). The input stages of the input column support input selection (e.g., routing) and a bypassable registering, with various clock modes as discussed in FIGS. 4-5. The circuit 600 may be built on an FPGA logic block. The input block may include 6 inputs 601a-f, with the inputs 601b-e driving into a Look Up Table 605 (LUT) with 16 random-access memory (RAM) bits specifying the output value for each of the 16 possible value combinations of these 4 inputs 601b-e. The two additional inputs 601a and 601f can drive the Enable 606 and Reset 607 pins on the flip-flop 610, depending on the states of the EE#608 and ER 609 configuration bits. In an alternative implementation, the circuit 600 can have configuration-bit-controlled multiplexer (not shown in FIG. 6) that can bypass the flip-flop 610.

The inputs 601b-e are examples of swappable inputs, which can be swapped between pairs. The circuit 600 can perform in the same way by re-arranging the table values inside the LUT 605. However, the top and bottom inputs 601a and 601f are not swappable. For example, when the top input 601a goes only to the EE#-controlled OR gate 611, any clock enabling signal for the flip-flop 610 may need to come from the input 601a. No other input pin provides this functionality, and thus input 601a is not swappable. If a register is to be added inside the input stage for the top input 601a, then the register can have a low hold-time by stealing the input stage of the adjacent input (e.g., input 601b) beneath the top input. As inputs 601b-e are swappable, inputs 601b-e can be arranged in a way such that input 601b does not need to be used. For example, in a routing network to the left of the inputs (not shown), the signal that drives the enable function of the flip-flop 610 is to be routed to the top input 601a, as well as input 601b, in order to provide a low hold-time.

Figure 7:
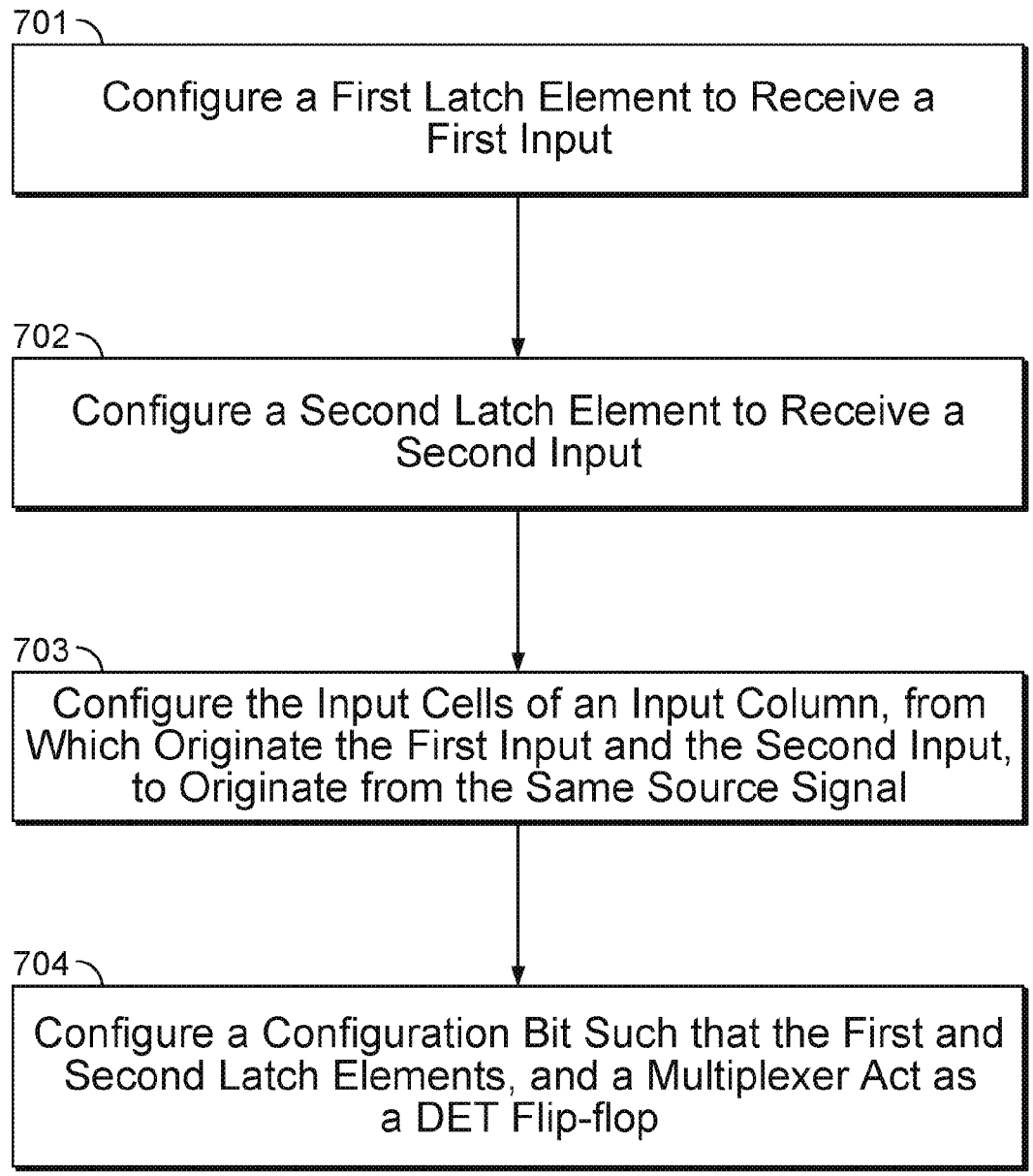
FIG. 7 shows a flow diagram illustrating aspects of configuring an input stage circuit with a low hold-time.

FIG. 7 provides a flow diagram illustrating aspects of configuring an input stage circuit with a low hold-time. At 701, a first latch element (e.g., see 302a in FIG. 3) can be configured to receive a first input (e.g., see 301a in FIG. 3). At 702, a second latch element (e.g., see 302b in FIG. 3) can be configured to receive a second input (e.g., see 301ab in FIG. 3). At 703, the input cells of an input column, from which originate the first input and the second input, can be configured to originate from the same source signal (e.g., see 601a-b in FIG. 6). At 704, a configuration bit can be configured such that the first latch element, second latch element and a multiplexer (e.g., see 303a in FIG. 3) can be operated as a DET flip-flop.

Figure 8:
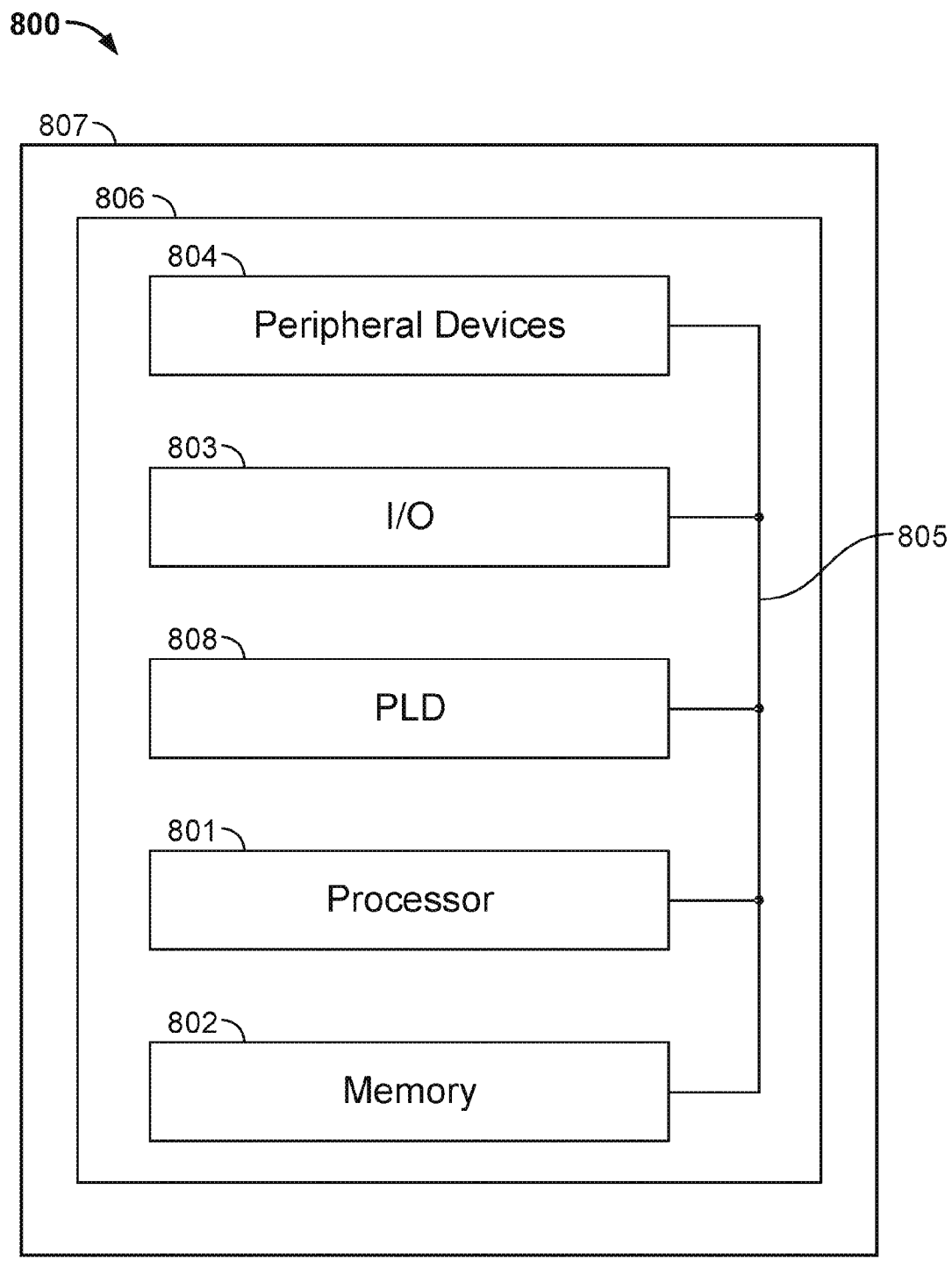
FIG. 8 is a simplified block diagram of an exemplary system employing a programmable logic device incorporating the present invention.

FIG. 8 is a simplified block diagram of an exemplary system employing a programmable logic device incorporating the present invention. A PLD 820 configured to include arithmetic circuitry according to any implementation of the present invention may be used in many kinds of electronic devices. One possible use is in an exemplary data processing system 800 shown in FIG. 8. Data processing system 800 may include one or more of the following components: a processor 801; memory 802; I/O circuitry 803; and peripheral devices 804. These components are coupled together by a system bus 805 and are populated on a circuit board 806 which is contained in an end-user system 807.

System 800 can be used in a wide variety of applications, such as computer networking, data networking, instrumentation, video processing, digital signal processing, Remote Radio Head (RRH), or any other application where the advantage of using programmable or reprogrammable logic is desirable. PLD 80 can be used to perform a variety of different logic functions. For example, PLD 80 can be configured as a processor or controller that works in cooperation with processor 801. PLD 80 may also be used as an arbiter for arbitrating access to shared resources in system 800. In yet another example, PLD 80 can be configured as an interface between processor 801 and one of the other components in system 800. It should be noted that system 800 is only exemplary, and that the true scope and spirit of the invention should be indicated by the following claims.

Various technologies can be used to implement PLDs 80 as described above and incorporating this invention.

Figure 9:
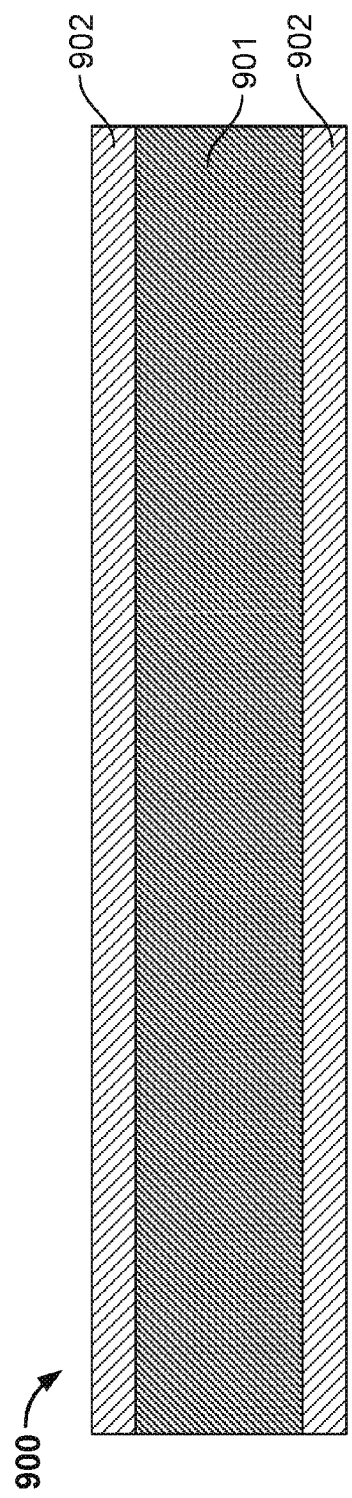
FIG. 9 presents a cross section of a magnetic data storage medium 900 which can be encoded with a machine executable program that can be carried out by systems such as the aforementioned personal computer, or other computer or similar device.

FIG. 9 presents a cross section of a magnetic data storage medium 900 which can be encoded with a machine executable program that can be carried out by systems such as the aforementioned personal computer, or other computer or similar device. Medium 900 can be a floppy diskette or hard disk, or magnetic tape, having a suitable substrate 901, which may be conventional, and a suitable coating 902, which may be conventional, on one or both sides, containing magnetic domains (not visible) whose polarity or orientation can be altered magnetically. Except in the case where it is magnetic tape, medium 900 may also have an opening (not shown) for receiving the spindle of a disk drive or other data storage device.

The magnetic domains of coating 902 of medium 900 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 10:
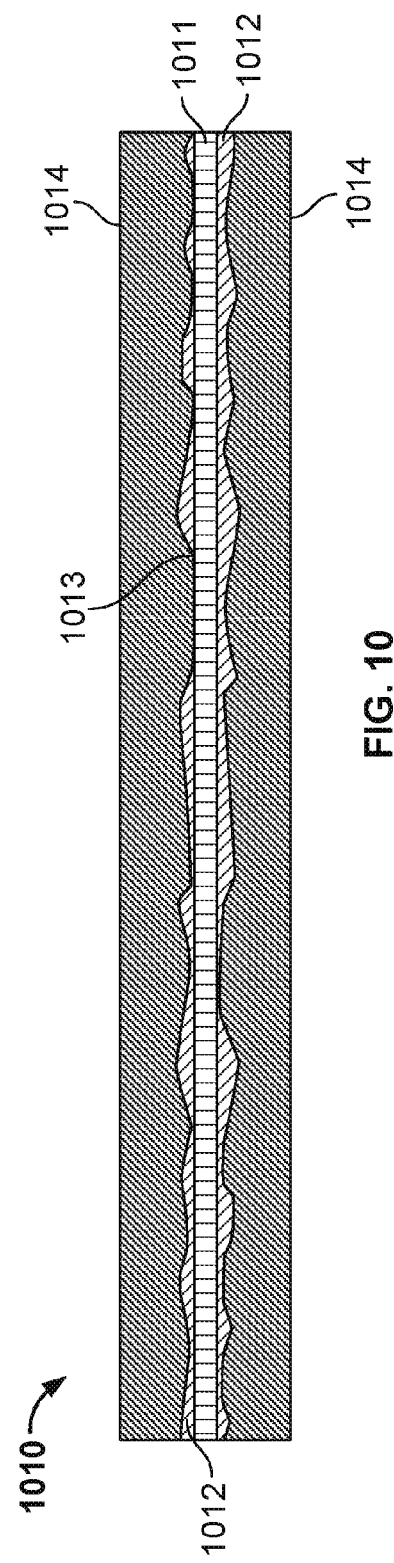
FIG. 10 shows a cross section of an optically-readable data storage medium 1010 which also can be encoded with such a machine-executable program, which can be carried out by systems such as the aforementioned personal computer, or other computer or similar device.

FIG. 10 shows a cross section of an optically-readable data storage medium 1010 which also can be encoded with such a machine-executable program, which can be carried out by systems such as the aforementioned personal computer, or other computer or similar device. Medium 1010 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1010 preferably has a suitable substrate 1011, which may be conventional, and a suitable coating 1012, which may be conventional, usually on one or both sides of substrate 1011.

In the case of a CD-based or DVD-based medium, as is well known, coating 1012 is reflective and is impressed with a plurality of pits 1013, arranged on one or more layers, to encode the machine-executable program. The arrangement of pits is read by reflecting laser light off the surface of coating 1012. A protective coating 1014, which preferably is substantially transparent, is provided on top of coating 1012.

In the case of magneto-optical disk, as is well known, coating 1012 has no pits 1013, but has a plurality of magnetic domains whose polarity or orientation can be changed magnetically when heated above a certain temperature, as by a laser (not shown). The orientation of the domains can be read by measuring the polarization of laser light reflected from coating 1012. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Circuitry for sequential input stages, the circuitry comprising:
   a first latch element receiving a first input, the first latch element connected to a first two-input multiplexer;
   a second latch element receiving a second input, the second latch element connected to the first two-input multiplexer;
   wherein the first input and the second input originate from different input cells of an input column that receive a same source signal, wherein the first input and the second input are configurable to receive either a same input value or different respective input values; and
   wherein, when the same input value is routed to the first input and the second input, a combination of the first latch element, the second latch element, and the first two-input multiplexer is configurable to collectively act as a Double-Edge-Triggered (DET) flip-flop and, when the different input values are routed to the first input and the second input, the combination of the first latch element, the second latch element, and the first two-input multiplexer is configurable to collectively not act as the Double-Edge-Triggered (DET) flip-flop.

2. The circuitry of claim 1, wherein the input column is connected to an input network that feeds a plurality of inputs to the input column.

3. The circuitry of claim 1, wherein input cells of the input column are at least partially connected to a look up table unit to specify an output value.

4. The circuitry of claim 1, wherein the DET flip-flop uses a first input stage of the first input and a second input stage of the second input to drive the same input value.

5. The circuitry of claim 1, wherein the DET flip-flop creates a hold-time that is substantially similar to a Master and Slave flip-flop.

6. The circuitry of claim 1, further comprising:
a third latch element receiving a third input, the third latch element connected to a second two-input multiplexer, wherein the second latch element is connected to the second two-input multiplexer; and
a fourth latch element receiving a fourth input, the fourth latch element connected to a third two-input multiplexer,
wherein the third latch element is connected to the third two-input multiplexer.

7. The circuitry of claim 6, wherein the second input, the third input and the fourth input are swappable such that an input value of the second input is configurable to be the same as the first input.

8. The circuitry of claim 1, further comprising:
a clock dividing circuit receiving a global clock signal and generating a local clock signal by dividing the global clock signal in half.

9. The circuitry of claim 8, wherein the clock dividing circuit is sharable between the first input and the second input.

10. The circuitry of claim 8, wherein the local clock signal is fed to a first clock control circuit associated with the first input and a second clock control circuit associated with the second input.

11. The circuitry of claim 8, wherein the clock dividing circuit has configuration bits to configure a clocking mode.

12. The circuitry of claim 11, wherein the configuration bits include a configuration bit controlling a multiplexer within the clock dividing circuit.

13. The circuitry of claim 11, wherein the clocking mode indicates an attribute of a latch enabling signal, or a pulse edge mode.

14. The circuitry of claim 10, wherein the first clock control circuit is configured by configuration bits for operating modes for the first input.

15. The circuitry of claim 14, wherein the configuration bits include any of a configuration bit relating to configuring the first two-input multiplexer, a configuration bit relating to configuring the first latch element, or a selection of the first input or the second input.

16. A method of configuring an input stage circuit, the method comprising:
configuring a first latch element to receive a first input, the first latch element connected to a first two-input multiplexer;
configuring a second latch element to receive a second input, the second latch element connected to the first two-input multiplexer and to a second two-input multiplexer;
configuring a third latch element to receive a third input, the third latch element connected to the second two-input multiplexer and a third two-input multiplexer; and
configuring the first input and the second input to originate from different input cells of an input column that receive a same source signal; and
configuring the different input cells of the first input and the second input to provide a same input value from the same source signal.

17. The method of claim 16, further comprising:
configuring at least one configuration bit associated with the first latch element or the first two-input multiplexer such that the first latch element, the second latch element and the first two-input multiplexer acts as a Double-Edge-Triggered (DET) flip-flop.

18. The method of claim 16, further comprising:
configuring at least one configuration bit associated with a clock dividing circuit to generate a local clock signal from a global clock signal by dividing the global clock signal in half,
wherein the local clock signal is fed to the first latch element and the second latch element.

19. A processor-readable non-transitory medium storing processor-executable instructions for configuring an input stage circuit, the processor-executable instructions comprising:
instructions executable by a processor to configure a first latch element to receive a first input, the first latch element connected to a first two-input multiplexer;
instructions executable by the processor to configure a second latch element to receive a second input, the second latch element connected to the first two-input multiplexer and to a second two-input multiplexer;
instructions executable by the processor to configure the first input and the second input to originate from different input cells of an input column that receive a same source signal;
instructions executable by the processor to configure the different input cells of the first input and the second input to provide a same input value from the same source signal; and
instructions executable by the processor to configure the first latch element, the second latch element, and the first two-input multiplexer to collectively act as a Double-Edge-Triggered (DET) flip-flop.

* * * * *